(12) United States Patent
Wintzer et al.

(10) Patent No.: US 9,139,461 B2
(45) Date of Patent: *Sep. 22, 2015

(54) SOLAR CONCENTRATOR

(75) Inventors: Wolfram Wintzer, Jena (DE); Lars Arnold, Neustadt (DE); Hagen Goldammer, Jena (DE)

(73) Assignee: Doctor Optics SE, Neustadt an der Orla (DE)

( * ) Notice: Subject to any disclaimer, the term of this patent is extended or adjusted under 35 U.S.C. 154(b) by 231 days.

This patent is subject to a terminal disclaimer.

(21) Appl. No.: 13/989,096

(22) PCT Filed: Nov. 11, 2011

(86) PCT No.: PCT/EP2011/005697
§ 371 (c)(1),
(2), (4) Date: May 23, 2013

(87) PCT Pub. No.: WO2012/072187
PCT Pub. Date: Jun. 7, 2012

(65) Prior Publication Data
US 2013/0239619 A1    Sep. 19, 2013

(30) Foreign Application Priority Data
Dec. 3, 2010  (DE) .......................... 10 2010 053 183

(51) Int. Cl.
| C03B 11/07 | (2006.01) |
| C03B 11/08 | (2006.01) |
| G02B 27/09 | (2006.01) |
| H01L 31/054 | (2014.01) |
| H01L 31/052 | (2014.01) |
| F24J 2/08 | (2006.01) |

(52) U.S. Cl.
CPC ................. *C03B 11/07* (2013.01); *C03B 11/08* (2013.01); *G02B 27/0994* (2013.01); *H01L 31/052* (2013.01); *H01L 31/0543* (2014.12); *C03B 2215/68* (2013.01); *F24J 2/08* (2013.01); *Y02E 10/52* (2013.01)

(58) Field of Classification Search
USPC .................................................. 65/85, 66, 83
See application file for complete search history.

(56) References Cited

U.S. PATENT DOCUMENTS

| 2005/0268660 A1* | 12/2005 | Hosoe et al. ..................... 65/102 |
| 2009/0101207 A1 | 4/2009 | Milbourne et al. |
| 2009/0114280 A1 | 5/2009 | Jensen |
| 2009/0152745 A1* | 6/2009 | Gibson et al. ................ 264/1.21 |
| 2012/0217663 A1* | 8/2012 | Wintzer et al. ............... 264/1.24 |

(Continued)

FOREIGN PATENT DOCUMENTS

| DE | 19510195 A1 | 9/1996 |
| DE | 100 20 396 | * 11/2001 |

(Continued)

OTHER PUBLICATIONS

DE 100 20 396, Krischke, machine translation, Nov. 2001.*

(Continued)

*Primary Examiner* — Mark Halpern
(74) *Attorney, Agent, or Firm* — Barnes & Thornburg LLP

(57) ABSTRACT

A solar concentrator includes a solid body of a transparent material, which comprises a light coupling-in surface and a light coupling-out surface. A supporting frame and a light-transmitting part are located between the light coupling-in surface and the light coupling-out surface.

10 Claims, 10 Drawing Sheets

(56) References Cited

U.S. PATENT DOCUMENTS

| | | | |
|---|---|---|---|
| 2012/0241000 A1* | 9/2012 | Wintzer et al. | 136/259 |
| 2013/0160852 A1* | 6/2013 | Wintzer et al. | 136/259 |
| 2014/0033767 A1* | 2/2014 | Wintzer et al. | 65/83 |
| 2015/0036976 A1* | 2/2015 | Wintzer et al. | 385/31 |

FOREIGN PATENT DOCUMENTS

| | | |
|---|---|---|
| DE | 10305059 A1 | 6/2004 |
| DE | 102004048500 A1 | 4/2006 |
| DE | 102006060141 A1 | 6/2008 |
| EP | 1396035 B1 | 1/2008 |
| EP | 2204606 A2 | 7/2010 |
| EP | 2264785 A2 | 12/2010 |
| EP | 2278631 A1 | 1/2011 |
| WO | 2008/122047 A1 | 10/2008 |
| WO | 2009109209 A1 | 9/2009 |
| WO | 2010/012474 A2 | 2/2010 |

OTHER PUBLICATIONS

Office Action issued in connection with German Patent Application No. DE 10 2011 118 455.8, Sep. 2012.

Bliedtner, J., et al. Optiktechnologie, Munich: Carl Hanser Verlag, 2008. S. 114-115. ISBN 978-3-446-40896-8.

International Preliminary Report on Patentability (Chapter I) issued on Jun. 4, 2013 in connection with PCT/EP2011/005697.

Jens Bliedtner and Gunter Grafe Optiktechnologie Mit 415 Abbildungen and 104 Tabellen, ISBN: 978-3-446-40896-8, 4 pages, Nov. 2008.

International Search Report and Written Opinion issued in connection with PCT/EP2011/005697, Nov. 2011.

* cited by examiner

SOLAR CONCENTRATOR

CROSS REFERENCE TO RELATED APPLICATIONS

This application is the U.S. national phase of PCT/EP2011/005697 filed Nov. 11, 2011, PCT/EP2011/005697 claims the benefit under the Convention of German Patent Application No. 10 2010 053 183.9 filed Dec. 3, 2010.

FIELD OF THE INVENTION

The invention concerns a solar concentrator including a solid body of transparent material, the solar concentrator comprising a light entry (sur)face and a light exit (sur)face.

BACKGROUND INFORMATION

FIG. 1 shows a known solar concentrator 101 which is depicted in FIG. 2 by way of a cross-sectional representation. The solar concentrator 101 comprises a light entry face 102 and a ground light exit face 103 as well as a light passage guide portion 104 located between the light entry face 102 and the light exit face 103 and tapering in the direction of the light exit face 103. Reference numeral 105 denotes a light-passage-guide-portion surface which restricts the light passage guide portion 104 between the light entry face 102 and the light exit face 103.

Document EP 1 396 035 B1 discloses a solar concentrator module comprising, on its frontal side, a front lens and, on its rear side, a receiver cell, and, between the front lens and the receiver cell, a reflector which has inclined side walls along at least two opposing sides of the receiver cell, and, in the center of the module, a flat vertical reflector, wherein the sidewall reflectors are shortened such that the ratio between the height H of the generator and the focal length F of the lens lies between 0.6 and 0.9.

SUMMARY

It is an object of the invention to reduce the costs for the production of solar concentrators. It is a further object of the invention to manufacture solar concentrators of a particularly high quality within restricted budget conditions.

The aforementioned object is achieved by a solar concentrator including a solid body of transparent material, which comprises a light entry (sur)face and a light exit (sur)face, wherein the solid body comprises a support frame situated between the light entry face and the light exit face, as well as a light passage (guide) portion, in particular tapering in the direction of the light exit face, which light passage (guide) portion is expediently restricted by a light-passage-(guide)-portion surface between the light entry face and the light exit face, and wherein the support frame comprises a flange-shaped outer edge (press-)blank-molded with full mold contact or completely (press-)blank-molded, respectively.

In the sense of the invention, a solar concentrator is, in particular, a secondary concentrator. In the sense of the invention, a solar concentrator has, in particular, an extension of between 5 mm and 60 mm, when seen in the direction of its optical axis. The diameter or the diagonal, respectively, of a light exit face, in the sense of the invention, amounts, in particular, to between 1.25 mm and 10 mm. In the sense of the invention, a solid body is, in particular, monolithic.

In the sense of the invention, transparent material is particularly glass. In the sense of the invention, transparent material is particularly inorganic glass. In the sense of the invention, transparent material is, in particular, silicate glass. In the sense of the invention, transparent material is, in particular, glass as described in Document PCT/EP2008/010136. In the sense of the invention, glass particularly comprises 0.2 to 2% by weight $Al_2O_3$,
0.1 to 1% by weight $Li_2O$,
0.3, in particular 0.4 to 1.5% by weight $Sb_2O_3$,
60 to 75% by weight $SiO_2$,
3 to 12% by weight $Na_2O$,
3 to 12% by weight $K_2O$, and/or
3 to 12% by weight $CaO$.

In the sense of the invention, the term press-molding is, in particular, to be understood in a manner that an optically operative surface is to be molded under pressure such that any subsequent finishing or post-treatment of the contour of this optically operative surface may be dispensed with or does not apply or will not have to be provided for, respectively. Consequently, it is particularly provided for that, after press-molding, the light exit face is not ground, i.e. it will not have to be treated by grinding.

In the sense of the invention, a support frame, in particular, may, as well, be a flange. In the sense of the invention, a support frame may, in particular, be designed to extend totally or at least partly circumferentially. In the sense of the invention, an outer edge or flange is, in particular, that part of the solar concentrator which is situated at the farthest distance from the optical axis of the solar concentrator. In the sense of the invention, an outer edge or flange is, in particular, that part of the solar concentrator which has the largest radial extension. In particular, it has been provided for that the support frame extends at least partly beyond the light passage guide portion in an orthogonal direction relative to the axis of the solar concentrator and/or that the support frame at least partly projects beyond the light passage guide portion radially with respect to the axis of the solar concentrator.

A light passage guide portion or -section (in the following, the term "portion" will be used, only, in context with this component through which light is guided to pass from entry to exit) taken in the sense of the invention, extends along the optical axis of the solar concentrator, in particular over a length which is larger than the diameter of the light exit face. A light-passage-guide-portion (or -section) surface, taken in the sense of the invention, is, in particular, inclined relative to the optical axis of the solar concentrator. An optical axis of the solar concentrator is, in particular, an or the orthogonal, respectively, of the light exit face. The light-passage-guide-portion (or -section) surface may be coated.

In an embodiment of the invention, the light exit face is press-molded. In an embodiment of the invention, the support frame comprises a surface including a step or set-off and facing the light exit face. The step extends, in particular, essentially in parallel to the optical axis of the solar concentrator.

The aforementioned object is, moreover, achieved by a solar concentrator including a solid body of transparent material, which body comprises a light entry (sur)face and a press-molded light exit (sur)face, wherein the solid body comprises a support frame situated between the light entry (sur)face and the light exit (sur)face, as well as, expediently, a light passage guide portion, in particular tapering in the direction of the light exit (sur)face, which light passage guide portion is expediently restricted by a light-passage-guide-portion surface between the light entry (sur)face and the light exit face, and wherein the support frame comprises a (sur)face facing the light exit (sur)face and including a step-like structure such as a step (this term being used in the following for reason of simplicity), set-off, stair or pitch. In particular, the step extends essentially in parallel to the optical axis of the solar concentrator.

In an embodiment of the invention the light-passage-guide-portion surface merges into the convex light exit face with a continuous first derivative. In an embodiment of the invention the light-passage-guide-portion surface merges into the light exit face with a curvature, the radius of which is not larger than 0.25 mm, preferably not larger than 0.15 mm, expediently not larger than 0.1 mm. In an embodiment of the invention the radius of curvature is more than 0.04 mm.

In a further embodiment of the invention, the light exit face is curved convexly. In a further embodiment of the invention, the convex light exit face is curved with a curvature of more than 30 mm. In a further embodiment of the invention, the light exit face is curved such that its (maximum) deviation of contour from the ideal plane or the light exit face, respectively, is less than 100 μm. In the sense of the invention, an ideal plane is, in particular, a plane through the transition of the light-passage-guide-portion surface into the light exit face. In the sense of the invention, a light exit plane is, in particular, a plane through the transition of the light-passage-guide-portion surface into the light exit face. In the sense of the invention, a light exit plane is, in particular, a plane parallel to the plane through the transition of the light-passage-guide-portion surface into the light exit face, when placed through the apex (of the curvature) of the light exit face. In the sense of the invention, a light exit plane is, in particular, a plane orthogonal to the tapering light passage guide portion when placed through the apex (of the curvature) of the light exit face. In the sense of the invention, a light exit plane is, in particular, a plane orthogonal to the optical axis of the solar concentrator when placed through the apex (of the curvature) of the light exit face. In a further embodiment of the invention, the light exit face is curved such that its (maximum) deviation of contour from the ideal plane or the light exit face, respectively, is more than 1 μm. In a further embodiment of the invention, the light exit face is planar. A planar light exit face may show a deviation of contour with respect to an ideal plane, said contour deviation being particularly due to shrinkage, in particular concave, and, for example, possibly amounting up to 20 μm or even up to 40 μm.

In an embodiment of the invention, the solar concentrator has a mass of between 2 g and 50 g. In an embodiment of the invention, the light entry face is press-molded. The light entry face may be shaped non-spherical or spherical or as a free form (shape).

The aforementioned object is, furthermore, achieved by a solar module comprising an aforementioned solar concentrator wherein the solar concentrator, by its light exit face is connected, in particular cemented, to a photovoltaic element. In an embodiment of the invention, the solar module comprises a heat sink or cooling body, on which the photovoltaic element is mounted. In an embodiment of the invention, a retention system for the solar concentrator is arranged on the heat sink body. In an embodiment of the invention, the solar module comprises a retention system for the solar concentrator. In an embodiment of the invention, the retention system fixedly attaches the solar concentrator to the support frame. In an embodiment of the invention, the solar module includes a lens for directing sunlight onto the light entry face of the solar concentrator The aforementioned object is, furthermore, achieved by a method for manufacturing a solar concentrator from transparent material, in particular for manufacturing an aforementioned solar concentrator, wherein the solar concentrator comprises a light entry face, a light exit face and, expediently, a light passage guide portion located between the light entry face and the light exit face and tapering in the direction of the light exit face, which light passage guide portion is restricted by a light-passage-guide-portion surface between the light entry face and the light exit face, wherein, between a first mold, in particular adapted for molding the light entry face, and at least one second mold, in particular adapted for molding the light exit face, the transparent material is press-molded for creating the solar concentrator, and wherein the transparent material is drawn into the second mold by means of a depression (explanatory note: also to be termed as low-pressure [LP], underpressure, [partial] vacuum, negative pressure, suction pressure, however, depression being used essentially throughout the following specification and claims) prior to press-molding, and is subsequently cooled down, however, prior to press-molding.

In the sense of the invention, cooling (down) may occur actively, in particular by feeding a coolant, or passively by waiting until the desired viscosity or temperature, respectively, is reached. The cooling (down) occurs, in particular, by delaying the closing of the mold formed by the first and the second mold after the transparent material has been drawn into the second mold in a liquid state by means of the depression. Herein, the delaying particularly includes a time interval of at least 1 s. The delaying includes, in particular, a time interval of, at the most, 10 seconds. Herein, the delaying, in particular, includes a time interval of at least $0.02\ t_{Tg}$. The delaying, in particular, includes a time interval of $0.15\ t_{Tg}$, at the utmost. The delaying or the cooling-down, respectively, in particular lasts $0.15\ t_{Tg}$, at the utmost. Herein, $t_{Tg}$ is the time which is necessary under the conditions of active and passive cooling-down, until every region of the transparent material has reached a temperature which is equal to or lies below the transformation temperature $T_g$.

While performing the cooling-down action or after cooling-down it may be provided for that the surface of the liquid transparent material facing the first mold is locally heated, for example by a flame.

In an embodiment of the invention, a support frame is provided between the light entry face and the light exit face. In an embodiment of the invention, a surface of the support frame facing the light exit face is press-molded by means of a first mold part of the second mold and by means of a second mold part of the second mold. In this context, it is particularly provided for that a step is press-molded into the surface of the support frame facing the light exit face, by means of the first mold part and the second mold part. In an embodiment of the invention, the first mold part encloses the second mold, in particular at least partially. In an embodiment of the invention, the light exit face is press-molded by means of at least a third mold part of the second mold. In a furthermore advantageous embodiment of the invention, the first mold part, in particular at least partially, encloses the third mold part. In performing pressure injection it is, in particular, provided for that the first mold and the second mold are (positioned with respect to each other and) made to approach each other. In this context, the first mold may be made to approach the second mold and/or the second mold may be made to approach the first mold. The first mold and the second mold are particularly made to approach each other as long until they contact each other or form a closed entire mold. In an embodiment of the invention, the first mold contacts the first mold part after the closing movement or while exerting pressure, respectively. In an embodiment of the invention, the second mold has a gap, particularly a circumferential gap, in particular an annular gap, which gap is provided in the area forming the transition between the light exit face and the light-passage-guide-portion surface. In an embodiment of the invention, the gap has a width of between 10 µm and 40 µm. In an embodiment of the invention, the depression is generated in the gap.

It is, in particular, provided for that, in its outer region, the transparent material is drawn into the second mold by means of a depression. It is, in particular, provided for that, the transparent material be cut as liquid glass and positioned within the second mold such that the cutting grain or seam lies outside the optical area. In a yet further preferred embodiment of the invention, the depression is at least 0.5 bar. In a yet further preferred embodiment of the invention, the depression corresponds, in particular, to vacuum. In a yet further preferred embodiment of the invention, the transparent material has a viscosity of no more than $10^{4.5}$ dPas immediately before molding.

In an embodiment of the invention, the solar concentrator, after press-molding, is drawn out of the second mold by means of a depression generated in the first mold. In an embodiment of the invention, the solar concentrator is subsequently cooled down in a suspended state. The cooling (down) may occur actively, in particular by feeding a coolant, or passively by waiting until the desired viscosity or temperature, respectively, is reached. The cooling (down) in a suspended state lasts, in particular, at least 5 seconds. Thereafter, it is particularly provided for that the solar concentrator be cooled on an appropriate support means on a cooling conveyor or leer.

The aforementioned object is, furthermore, achieved by a method for manufacturing a solar concentrator from transparent material, in particular for manufacturing an aforementioned solar concentrator, wherein the solar concentrator comprises a light entry face, a light exit face and, expediently, a light passage guide portion located between the light entry face and the light exit face and tapering in the direction of the light exit face, which light passage guide portion is restricted by a light-passage-guide-portion surface between the light entry face and the light exit face, wherein the transparent material is press-molded between a first mold adapted for molding the light entry face and at least one second mold adapted for molding the light exit face, and is subsequently drawn out of the second mold by means of a suction pressure generated in the first mold.

In an embodiment of the invention, the solar concentrator is subsequently cooled down in a suspended state. The cooling (down) may occur actively, in particular by feeding a coolant, or passively by awaiting the reaching of the desired viscosity or temperature, respectively. The cooling (down) in a suspended state lasts, in particular, at least 5 seconds. It is particularly provided for that, thereafter, the solar concentrator be cooled on an appropriate support means on a cooling conveyor or on a leer (lehr).

In an embodiment of the invention, a support frame is provided between the light entry face and the light exit face. In an embodiment of the invention, a surface of the support frame facing the light exit face is press-molded by means of a first mold part of the second mold and by means of a second mold part of the second mold. Herein, it is, in particular, provided for that a step or set-off is press-molded into the support frame's surface facing the light exit face, by means of the first mold part and the second mold part. In an embodiment of the invention, the first mold part surrounds the second mold part, in particular at least partially. In an embodiment of the invention, the light exit face is press-molded by means of at least a third mold part of the second mold. In an embodiment of the invention, the first mold part, in particular at least partially, encloses the third mold part. For performing pressure injection it is, in particular, provided for that the first mold and the second mold are (positioned with respect to each other and) made to approach each other. Herein, the first mold may be made to approach the second mold and/or the second mold may be made to approach the first mold. The first mold and the second mold are particularly made to approach each other as long until they contact each other or form a compact entire or overall mold. In an embodiment of the invention, the first mold contacts the first mold part after the closing movement or while exerting pressure, respectively. In an embodiment of the invention, the second mold has a gap, particularly a circumferential gap, in particular an annular gap, which gap is provided in the area forming the transition between the light exit face and the light-passage-guide-portion surface. In an embodiment of the invention, the gap has a width of between 10 µm and 40 µm. In an embodiment of the invention, the depression is generated in the gap.

The aforementioned object is, furthermore, achieved by a method for manufacturing a solar concentrator of transparent material, in particular for manufacturing an aforementioned solar concentrator, wherein the solar concentrator comprises a light entry face, a light exit face, a support frame between the light entry face and the light exit face, as well as, expediently, a light passage guide portion located between the light entry face and the light exit face and, in particular, tapering in the direction of the light exit face, which light passage guide portion is restricted by a light-passage-guide-portion surface between the light entry face and the light exit face, wherein, between a first mold for molding the light entry face and at least one second mold for molding the light exit face, the transparent material is press-molded for creating the solar concentrator, wherein a surface of the support frame facing the light exit face is press-molded by means of a first mold part of the second mold and by means of a second mold part of the second mold, wherein the first mold part, at least partially, encloses the second mold part, and wherein the light exit face is press-molded by means of at least a third mold part of the second mold. Herein, it is, in particular, provided for that a step or set-off is injection (-press) molded, by means of the first mold part and of the second mold, into the support frame's surface facing the light exit face.

In an embodiment of the invention, the first mold part, in particular at least partially, encloses the third mold part. In performing pressure injection it is, in particular, provided for that the first mold and the second mold are (positioned with respect to each other and) made to approach each other. In this context, the first mold may be made to approach the second mold and/or the second mold may be made to approach the first mold. The first mold and the second mold are particularly made to approach each other as long until they contact each other or form a compact overall mold, respectively. In an embodiment of the invention, the first mold contacts the first mold part after the closing movement or while exerting pressure, respectively. In an embodiment of the invention, the second mold has a gap, particularly a circumferential gap, especially an annular gap, which gap is provided in the area forming the transition between the light exit face and the light-passage-guide-portion surface. In an embodiment of the invention, the gap has a width of between 10 µm and 40 µm. In an embodiment of the invention, the depression is generated in the gap The aforementioned object is, furthermore, achieved by a method for manufacturing a solar concentrator from transparent material, in particular for manufacturing an aforementioned solar concentrator, wherein the solar concentrator comprises a light entry face, a light exit face, a support frame arranged between the light entry face and the light exit face and including an outer flange or edge, as well as a light passage guide portion, arranged between the light entry face and the light exit face and expediently tapering in the direction of the light exit face, which light passage guide portion is restricted by a light-passage-guide-portion surface between the light entry face and the light exit face, wherein, between a first mold, in particular for molding the light entry face, and at least one second mold, in particular for molding the light exit face, the transparent material is press-molded such for creating the solar concentrator that the outer flange/edge is press-molded at complete mold contact.

In an embodiment of the invention, a surface of the support frame facing the light exit face is press-molded by means of a first mold part of the second mold and by means of a second mold part of the second mold. Herein, it is, in particular, provided for that, by means of the first mold part and by means of the second second part a step (set-off) is pressed into surface of the support frame facing the light exit face. In a furthermore advantageous embodiment of the invention, the first mold part surrounds the second mold part, in particular at least partially. In an embodiment of the invention, the light exit face is press-molded by means of a third mold part of the second mold. In an embodiment of the invention, the first mold part encloses the third mold part, in particular at least partially. In performing pressure injection it is, in particular, provided for that the first mold and the second mold are (positioned with respect to each other and) made to approach each other. In this context, the first mold may be made to approach the second mold and/or the second mold may be made to approach the first mold. The first mold and the second mold are particularly made to approach each other as long until they contact each other or form a compact overall mold, respectively. In an embodiment of the invention, the first mold contacts the first mold part after the closing movement of the mold or while exerting pressure, respectively. In an embodiment of the invention, the second mold has a gap, particularly a circumferential gap, in particular an annular gap, which gap is provided in the area forming the transition between the light exit face and the light-passage-guide-portion surface. In an embodiment of the invention, the gap has a width of between 10 μm and 40 μm. In an embodiment of the invention, the depression is generated in the gap.

In an embodiment of the invention, the light exit face is press-molded. It is, in particular, provided for that, the transparent material be cut as liquid glass and, in particular, be positioned within the second mold such that the cutting grain or seam lies outside the optical area. In performing pressure injection it is, in particular, provided for that the first mold and the second mold are (positioned with respect to each other and) made to approach each other. In a yet further preferred embodiment of the invention, the depression (under- or low-pressure, cf. above) amounts to at least 0.5 bar. In a yet further preferred embodiment of the invention, the depression corresponds, in particular, to vacuum. In a yet further preferred embodiment of the invention, the transparent material has a viscosity of no more than $10^{4.5}$ dPas immediately before molding.

In an embodiment of the invention, the solar concentrator, after press-molding is drawn or lifted out of the second mold by means of a depression generated in the first mold. In an embodiment of the invention, the solar concentrator is subsequently cooled down in a suspended state or position. The cooling (down) may occur actively, in particular by feeding a coolant, or passively by awaiting that the desired viscosity or temperature, respectively, is reached. The cooling (down) in a suspended state lasts, in particular, at least 5 seconds. It is particularly provided for that, thereafter, the solar concentrator be cooled on an appropriate support means on a cooling conveyor (leer or lehr).

The aforementioned object is, furthermore, achieved by a method for manufacturing a solar module, wherein an aforementioned solar concentrator is, by its light exit face, connected to a photovoltaic element and/or fixedly directed towards a photovoltaic element.

In an advantageous process for generating electric energy, sunlight is made to enter the light entry face of a solar concentrator of an aforementioned solar module. In a further advantageous process for generating electric energy, sunlight is made to enter the light entry face of an aforementioned solar concentrator.

The invention particularly enables to reduce shrinkage of the light passage guide section or to shift such shrinking to the support frame. Moreover, it is possible to achieve a press-molded light exit face even in the case of slight fluctuations of the transparent material supplied. By means of the invention it is, in particular, possible to accomplish a solar concentrator in one pressing step, only, which, in context with the high quality of such a solar concentrator leads to a reduction of the costs for the production thereof.

Further advantages and details of the present invention will become apparent from the following description of preferred examples of embodiment.

DETAILED DESCRIPTION

Figure 1:
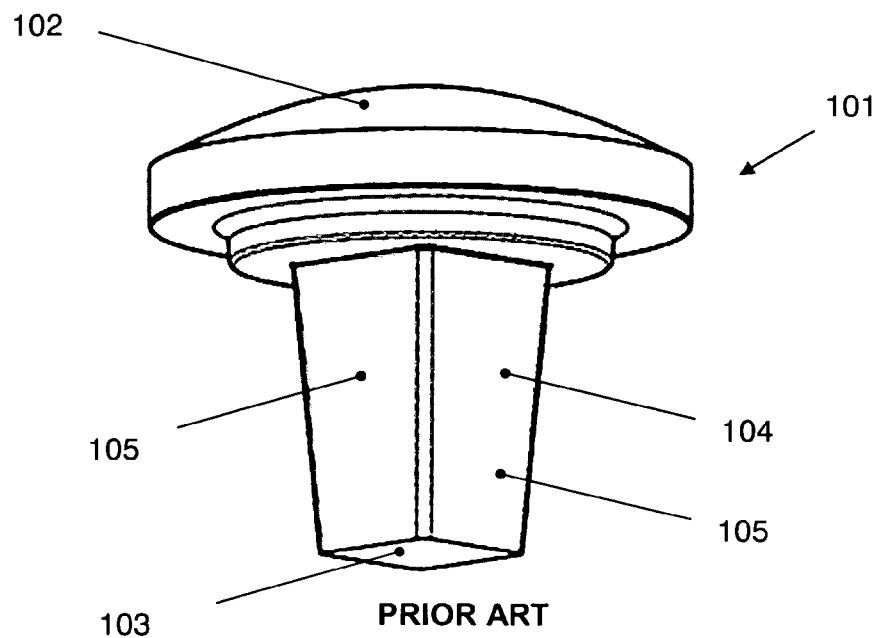
FIG. 1 shows a perspective representation of a known solar concentrator.
Figure 2:
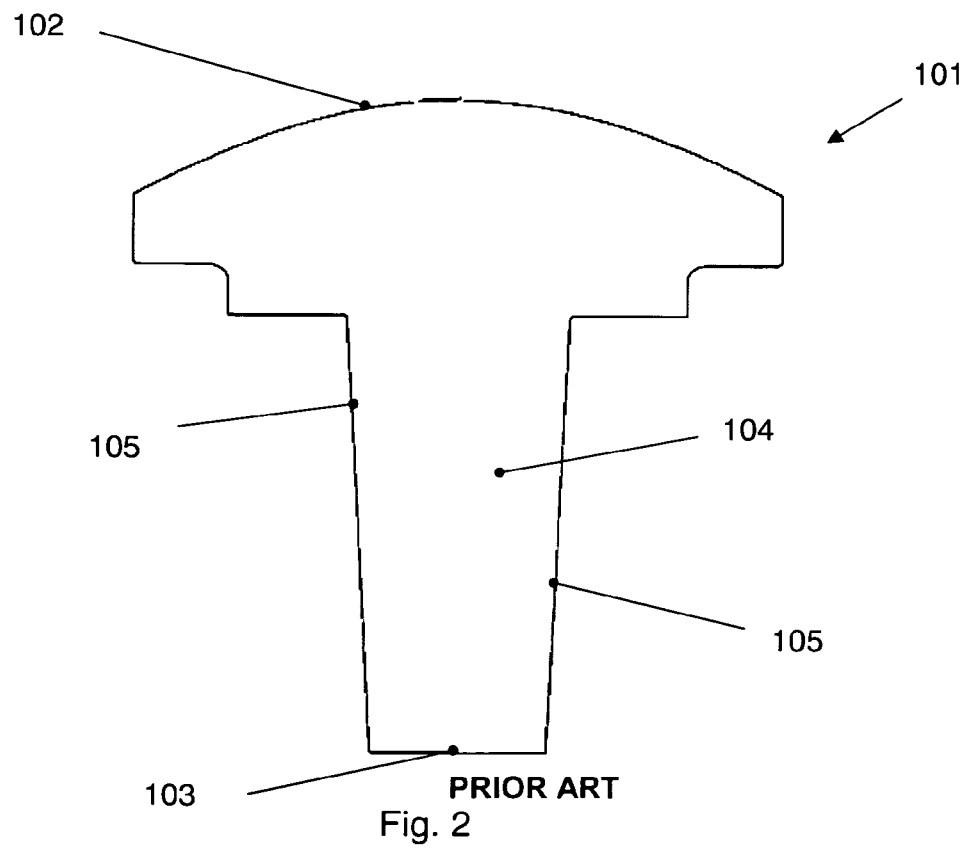
FIG. 2 shows a cross-sectional representation of the solar concentrator as shown in FIG. 1.
Figure 3:
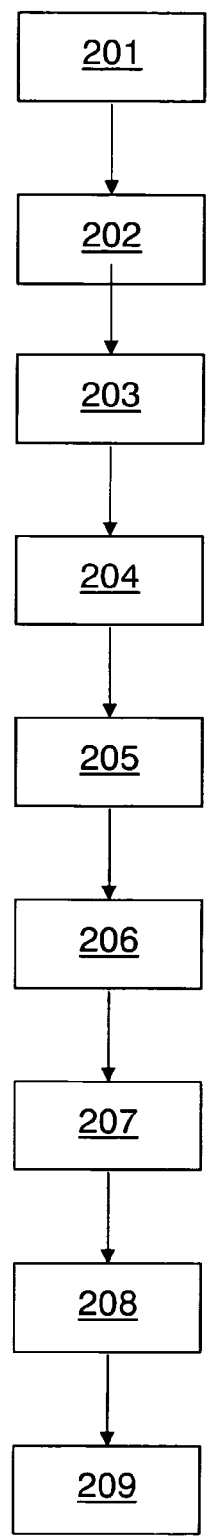
FIG. 3 shows a method for manufacturing a solar concentrator.
Figure 4:
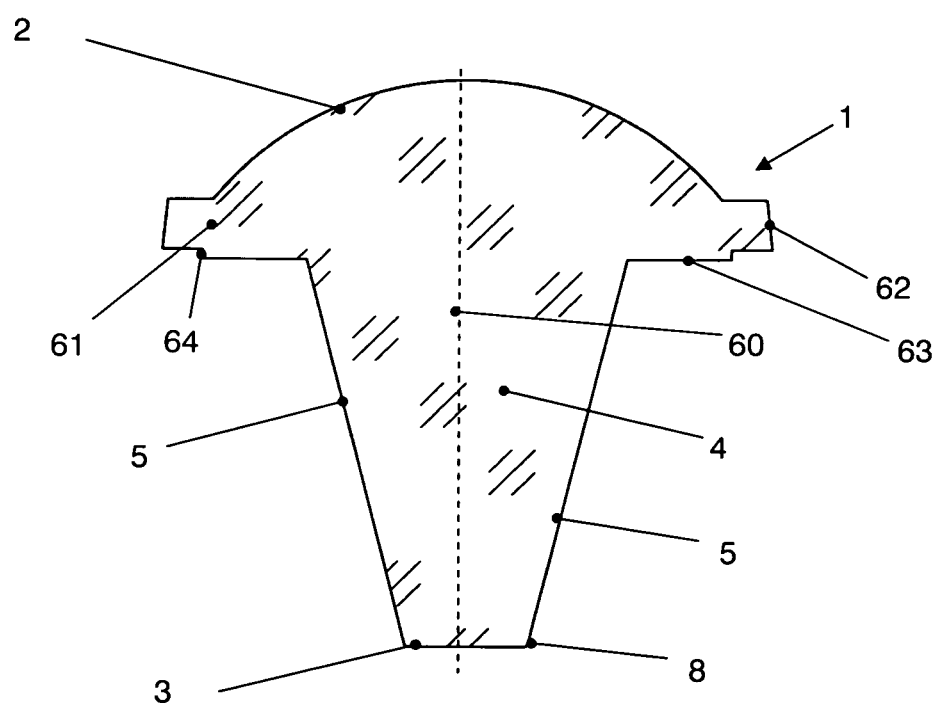
FIG. 4 shows an example of embodiment of a solar concentrator according to the present invention.

FIG. 3 shows a method or process for manufacturing the solar concentrator 1 according to FIG. 4, with the solar concentrator 1 in FIG. 4 having been depicted by way of a cross-sectional representation. The solar concentrator 1 is a monolithic component of glass, comprising 0.2 to 2% by weight $Al_2O_3$,
0.1 to 1% by weight $Li_2O$,
0.3, in particular 0.4 to 1.5% by weight $Sb_2O_3$,
60 to 75% by weight $SiO_2$,
3 to 12% by weight $Na_2O$,
3 to 12% by weight $K_2O$, and
3 to 12% by weight CaO.

Figure 5:
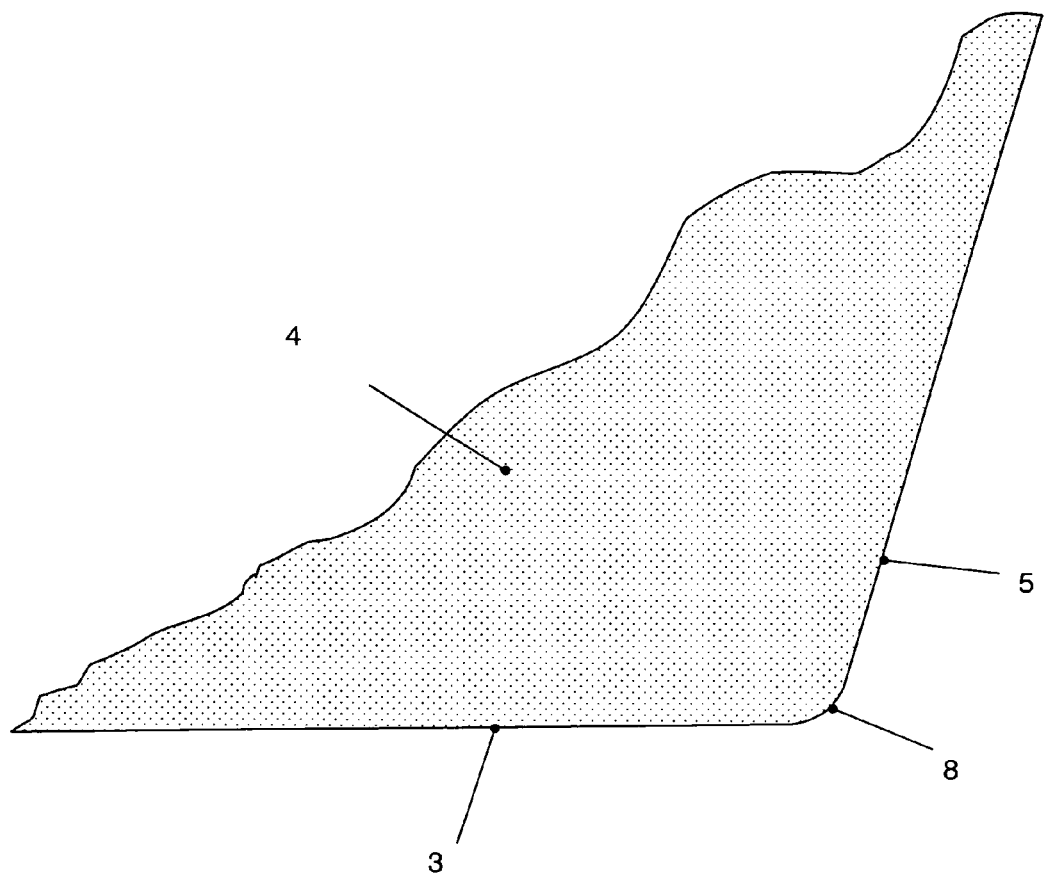
FIG. 5 shows an enlarged cut-out of the solar concentrator according to FIG. 4.

The solar concentrator 1 comprises a light entry (sur)face 2 and a press-molded light exit (sur)face 3 as well as a light passage guide portion 4 arranged between the light entry face 2 and the light exit face 3 and tapering in the direction of the light exit face 3. Reference numeral 5 designates a press-molded light-passage-guide-portion surface which restricts the light passage guide portion 4 between the light entry face 2 and the light exit face 3. Herein, the light-passage-guide-portion surface 5 merges—as has been represented in greater detail in FIG. 5—into the light exit face with a curvature 8 whose radius of curvature is approximately 0.1 mm. The solar concentrator 1 moreover comprises a support frame 61 including a press-molded outer frame 62. Moreover, the support frame has a surface 63 facing the light exit face 3 and including a step, set-off or pitch 64.

Figure 6:
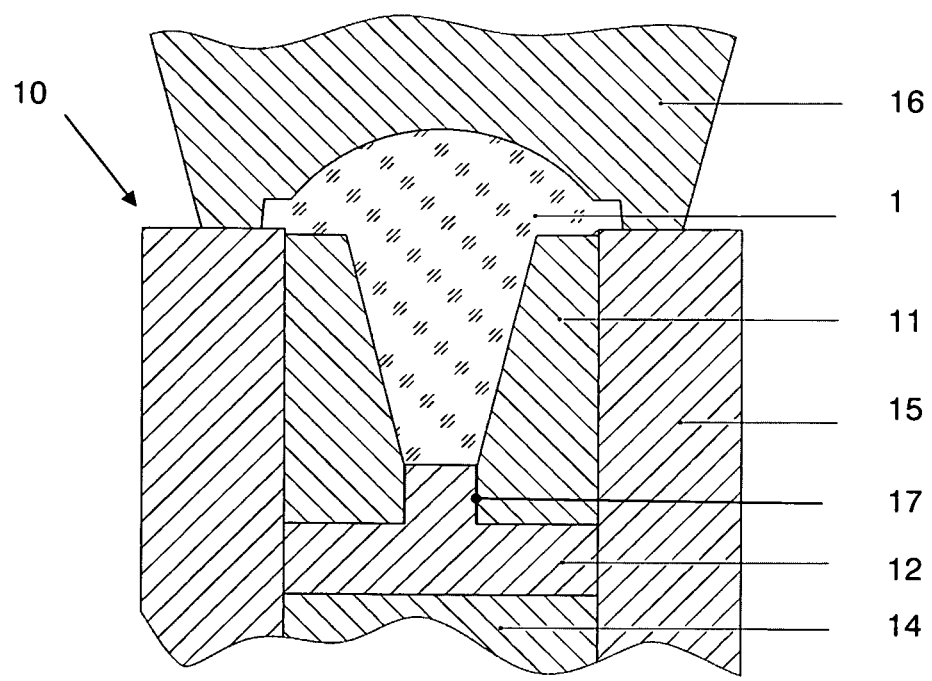
FIG. 6 shows an example of embodiment of a mold for molding the solar concentrator according to FIG. 4.

The process represented in FIG. 3 starts with procedural stage or step 201, in which a drop of transparent material is cut-off at the outlet of a dispenser. To this end a partial mold 10 shown in FIG. 6 is positioned under the outlet so that the drop directly ends up in or falls into, respectively, partial mold 10. It may be provided for that the drop is either cut and falls into the partial mold 10 or is received while flowing through partial mold 10 to be cut then. The partial mold 10 is an example of embodiment for a second partial mold taken in the sense of the claims.

The partial mold 10 comprises a mold part 15, a mold part 11 for forming the light-passage-guide-portion surface 5 and a mold part 12 for forming the light exit face 3, wherein the mold part 15 surrounds or encloses the mold part 11 and the mold part 12. The mold part 15 is an example of embodiment of a first mold part taken in the sense of the claims. The mold part 11 is an example of embodiment of a second mold part taken in the sense of the claims and the mold part 12 is an example of embodiment of a third mold part taken in the sense of the claims. Moreover, the partial mold 10 comprises a supporting rest 14 for the partial mold 12. The partial mold 12 comprises a mandrel surrounded by the partial mold 11, a circumferential gap 17 being formed between the mandrel of partial mold 12 and the partial mold 11.

Step 201 is followed by step 202 in which a depression (low or negative pressure, pressure lower than surrounding pressure, underpressure) is generated in gap 17 so that the transparent material is drawn or sucked into the partial mold 10. A step 203 follows, in which the liquid material is cooled down for a period of between 0.02 $t_{Tg}$ and 0.15 $t_{Tg}$, wherein $t_{Tg}$, under the conditions of active and passive cooling down, is the time necessary until every region of the transparent material has reached a temperature equal to or lying below the transformation temperature $T_g$. In the course of steps 202 and 203 or thereafter the partial mold 10 is positioned in a pressing (injecting) apparatus. An optional step 204 follows during which a surface of the transparent material facing a partial mold 16, which surface forms the light entry face 2, is heated after pressing, e.g. by fire or flame polishing.

A step 205 follows, in which the transparent material is press-molded between the partial mold 10 and the partial mold 16 to form the solar concentrator 1. Herein, it is provided for that the outer edge, flange or frame 62 of the support frame 61 is press-molded with full mold contact. The partial mold 16 and the mold part 15 are brought into contact with each other. The step 64 is formed by means of a set-off between the 15 and the mold part 11.

A step 206 follows, in which the mold formed by the partial mold 10 and the partial mold 16 is opened. To this end, the partial mold 16 is, for example, moved upwardly. It is provided for that a depression is generated within the partial mold 16 so that the fully pressed solar concentrator 1, together with the partial mold 16, is moved out of the partial mold 10. It may be provided for that subsequently certain regions of the solar concentrator 1 are blown with cooling air. Alternatively or additionally it may be provided for that the light-passage-guide-portion surface 5 is heated.

There is provided an optional step 207 in which the solar concentrator 1 is hot-coated. Moreover, an optical/visual inspection of the solar concentrator 1 is provided for by means of an optional step 208. A step 209 follows, in which the solar concentrator 1 is delivered to a leer (cooling path) and is selectively cooled down herein.

Figure 7:
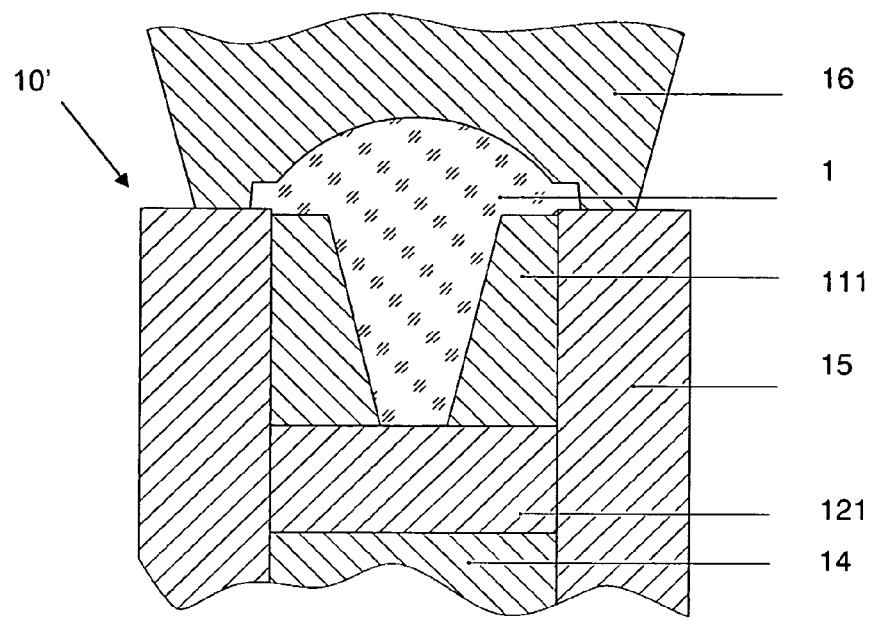
FIG. 7 shows an alternative example of embodiment of a mold for molding the solar concentrator according to FIG. 4.

FIG. 7 shows an alternative embodiment of a partial mold 10' to be used instead of the partial mold 10, wherein same reference numerals as in FIG. 6 designate same or similar elements, respectively. The partial mold 10' comprises, inter alia, a partial mold 111 for forming the light-passage-guide-section surfaces 5 as well as a mold part 121 for molding/forming the light exit face 3. The mold part 111 is an example of embodiment of a second mold part in the sense of the claims and the mold part 121 is an example of embodiment of the third mold part in the sense of the claims. In the mold part 121 channels may be arranged, with the aid of which a depression may be generated, by means of which the transparent material is drawn into the partial mold 10'.

Figure 8:
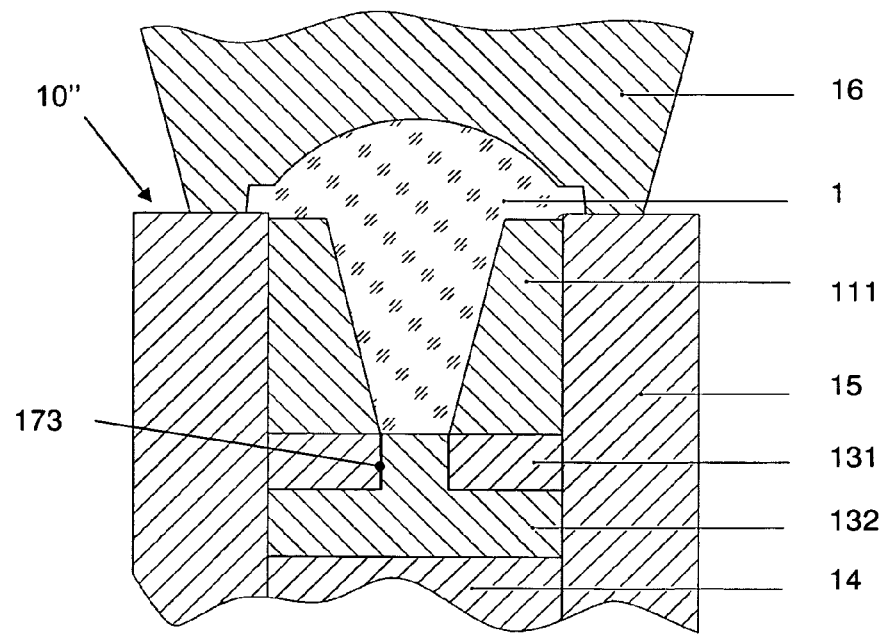
FIG. 8 shows a further alternative example of embodiment of a mold for molding the solar concentrator according to FIG. 4.

FIG. 8 shows a further alternative example of embodiment of a partial mold 10" for the purpose of alternative use instead of partial mold 10 or partial mold 10', respectively, wherein same reference numerals as in FIG. 6 or FIG. 7 designate same or similar elements, respectively. In the place of mold part 121 the partial mold 10" comprises a mold part 132 for molding the light exit face 3. The mold part 132 is an example of embodiment of a third mold part in the sense of the claims. The mold part 132 is designed corresponding to mold part 12 and comprises a mandrel which is surrounded by a mold part 131, so that a gap 172 corresponding to gap 17 is formed.

Figure 9:
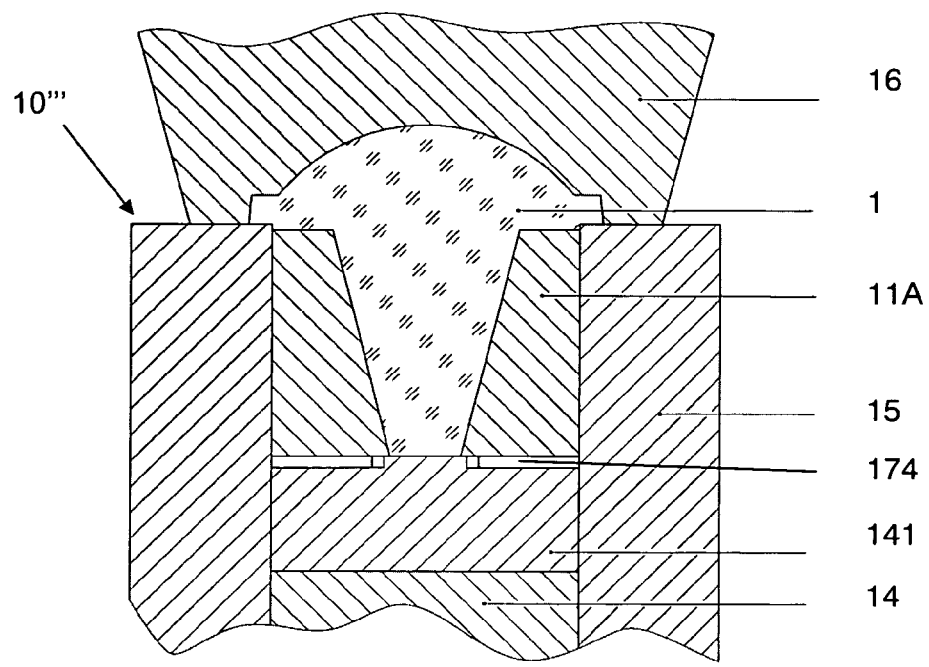
FIG. 9 shows a further alternative example of embodiment of a mold for molding the solar concentrator according to FIG. 4.

FIG. 9 shows a further alternative example of embodiment of a partial mold 10''' for the purpose of alternative use instead of partial mold 10 or partial mold 10' or partial mold 10", respectively, wherein same reference numerals as in FIG. 6 or FIG. 7 or FIG. 8, respectively, designate same or similar elements, respectively. In the place of mold part 121 the partial mold 10''' comprises a mold part 141 for molding the light exit face 3. The mold part 141 is an example of embodiment of a third mold part in the sense of the claims. Channels 174 are formed between the mold part 111 and mold part 141, with the aid of which a depression may be generated, by means of which the transparent material is drawn into the partial mold 10'''.

Figure 10:
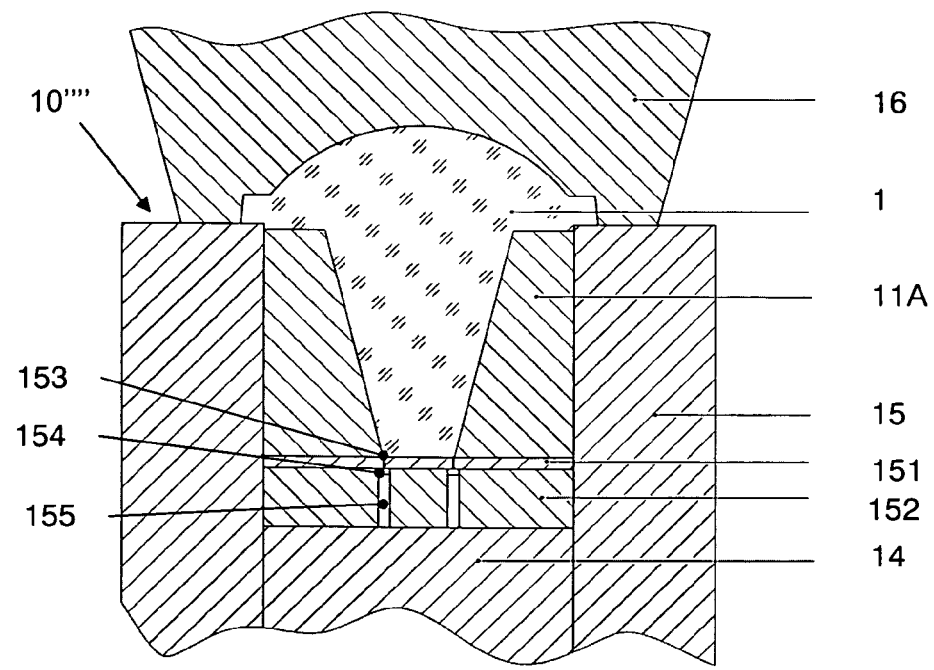
FIG. 10 shows a further alternative example of embodiment of a mold for molding the solar concentrator according to FIG. 4.

FIG. 10 shows a further alternative example of embodiment of a partial mold 10'''' for the purpose of alternative use instead of partial mold 10, partial mold 10', partial mold 10" or partial mold 10''', respectively, wherein same reference numerals as in FIG. 6, FIG. 7, FIG. 8, or FIG. 9, respectively, designate same or similar elements, respectively. In the place of mold part 121 the partial mold 10'''' comprises a support plate 152 as well as a plate 151 arranged between the support plate 152 and the partial mold 111. The plate 151 may well be a plastic film or foil. The plate 151 comprises a perforation 153. In the present example of embodiment, the perforation 153 comprises holes arranged in plate 151 along the circumference of a square, which holes are arranged at a distance of approximately 200 μm from each other and have an opening cross section of 50 μm. The holes of perforation 153 are particularly produced by means of laser perforation. The light exit face 3 is formed by means of the plate 151, wherein the holes of the perforation 153 are arranged at the edge of the light exit face 3 or slightly outside the light exit face 3, respectively, so that the geometric shape of the perforation 153 may well be similar to the geometric shape of the light exit face 3, but it will be a little larger than that latter shape.

The support plate 152 comprises a circumferential channel 154 on its side facing the plate 151, into which channel the holes of the perforation 153 open out. Via bores 155, which open out into the circumferential channel 154, a depression (underpressure, low- or negative pressure) in the range of a vacuum is generated in the circumferential channel 154 and thus in the holes of the perforation 153. By this depression the transparent material or the liquid glass is drawn into the partial mold 10"".

Figure 11:
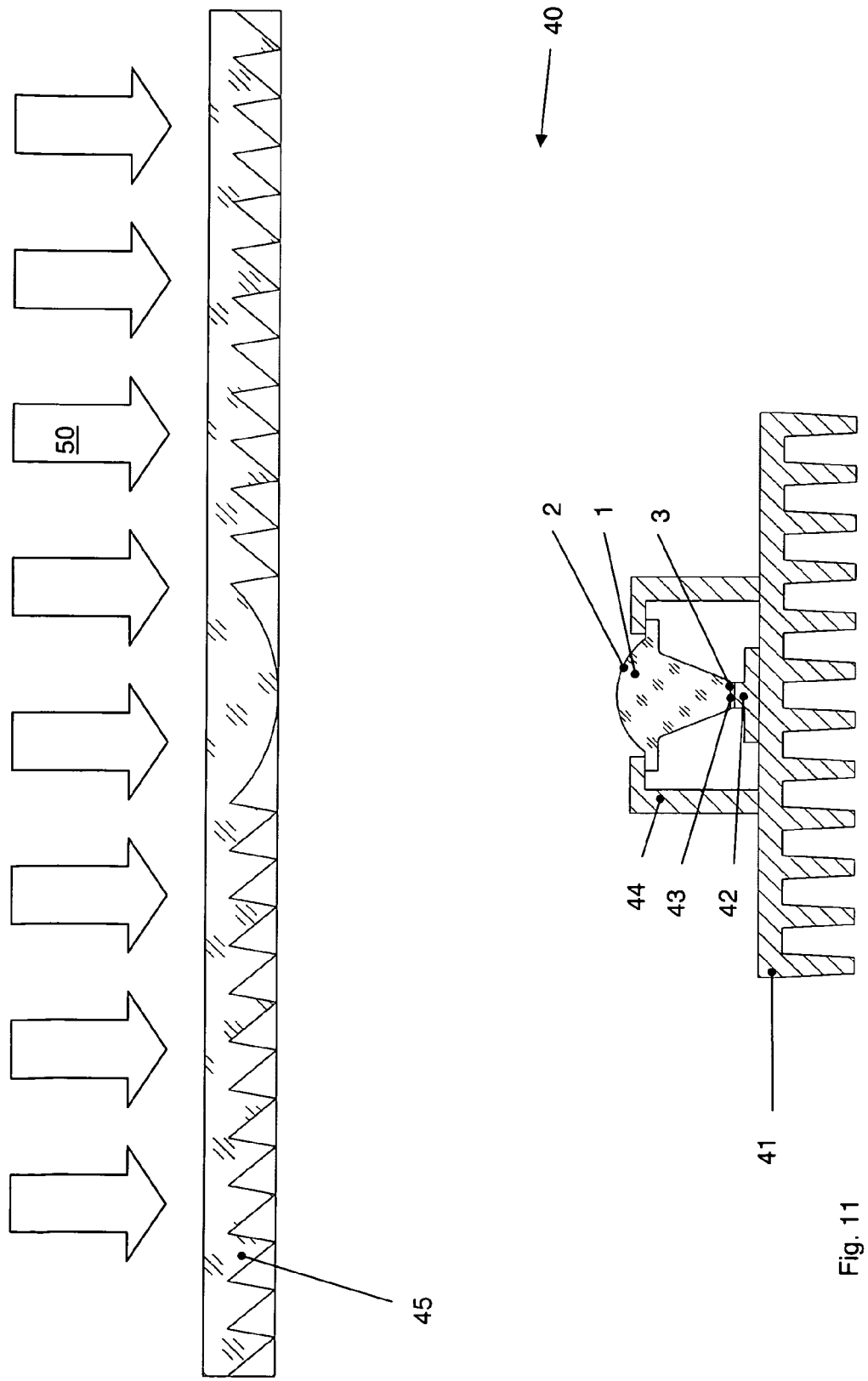
FIG. 11 shows an example of embodiment of a solar module including a solar concentrator according to the invention.

FIG. 11 shows an example of embodiment of a solar module 40 including a solar concentrator 1 according to the invention. The solar module 40 comprises a heat sink (cooling body or cooling element) 41, on which a photovoltaic element 42 and a retention system 44 for the solar concentrator 1 are arranged. The light exit face 3 is connected to the photovoltaic element 42 by means of an adhesive layer 43. The solar module 40 moreover comprises a primary solar concentrator 45 designed as a Fresnel lens for directing sunlight 50 onto the light entry face 2 of the solar concentrator 1, the latter arranged or designed or provided, respectively, as a secondary solar concentrator. The sunlight induced into or made to enter the solar concentrator 1 via the light entry face 2 exits via the light exit face 3 of the solar concentrator 1 and makes impact with or impinges the photovoltaic element 42.

Figure 12:
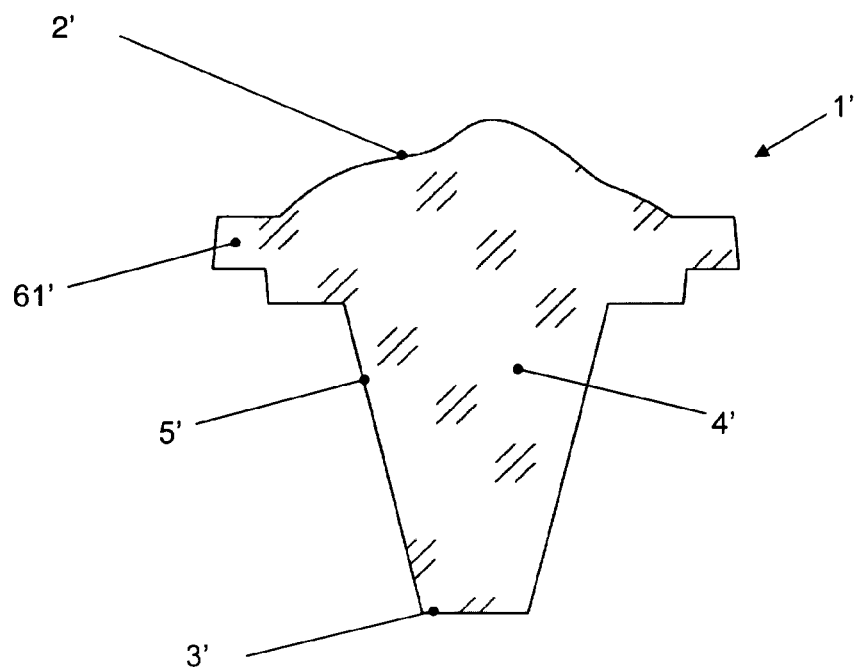
FIG. 12 shows an alternative example of embodiment of a solar concentrator according to the invention.
Figure 13:
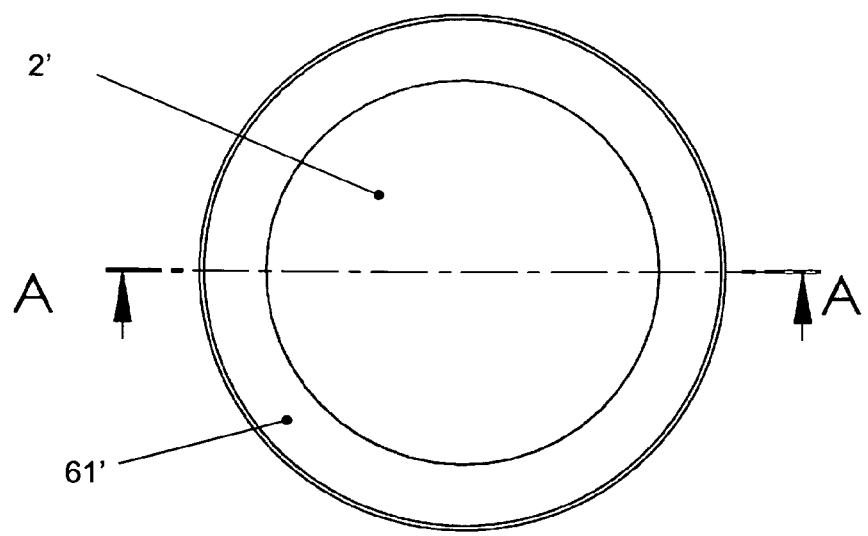
FIG. 13 shows a top view of a solar concentrator according to FIG. 12.

FIG. 12 and FIG. 13 show an alternatively designed solar concentrator 1', wherein FIG. 12 shows a cross sectional representation along the sectional line A-A of FIG. 13, the latter showing a top view of the solar concentrator 1'. Deviating from the solar concentrator 1, solar concentrator 1' comprises, inter alia, a light entry face 2', which is designed as a free form. The solar concentrator 1', moreover, comprises a press-molded light exit face 3' as well as a light passage guide section 4' which is arranged between the light entry face 2' and the light exit face 3' and tapers in the direction of the light exit face 3'. Reference numeral 5' designates a light-passage-guide-portion surface which restricts the light passage guide portion 4' between the light entry face 2' and the light exit face 3'. The solar concentrator 1' additionally comprises a support frame 61' having a circular outer edge.

Figure 14:
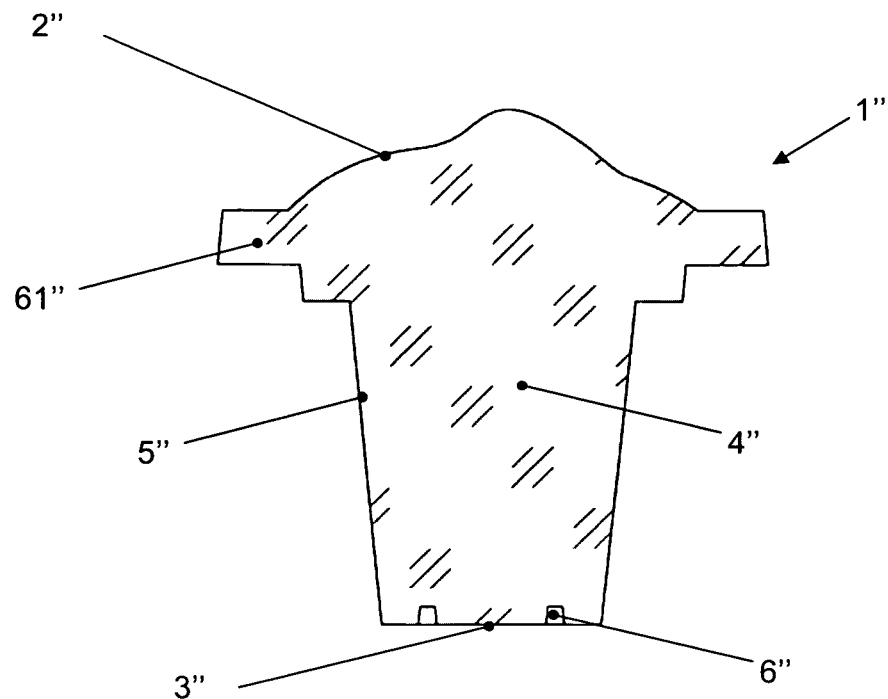
FIG. 14 shows a further alternative example of embodiment of a solar concentrator according to the invention.
Figure 15:
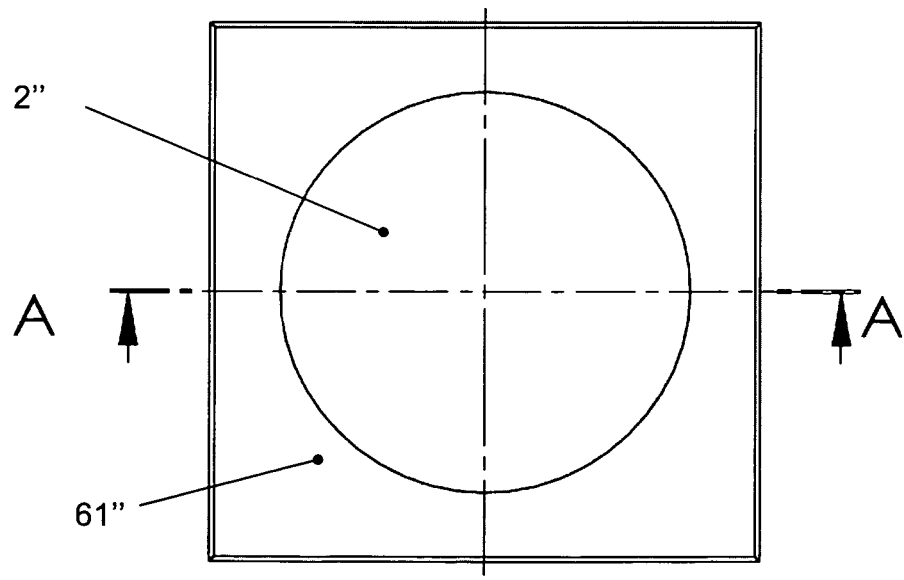
FIG. 15 shows a top view of a solar concentrator according to FIG. 14.

FIG. 14 and FIG. 15 a show an alternatively designed solar concentrator 1", wherein FIG. 14 shows a cross sectional representation along the sectional line A-A of FIG. 15, the latter showing a top view of the solar concentrator 1". Deviating from the solar concentrator 1, solar concentrator 1" comprises, inter alia, a light entry face 2", which is designed as a free mold. The solar concentrator 1", moreover, includes a light exit face 3" which is restricted by a circumferential groove 6", as well as a light passage guide section 4" which is arranged between the light entry face 2" and the light exit face 3" and tapers in the direction of the light exit face 3". Reference numeral 5" designates a light-passage-guide-portion surface which restricts the light passage guide portion 4" between the light entry face 2" and the light exit face 3". The solar concentrator 1" additionally comprises a support frame 61" having a square outer edge. The outer edge may also be polygonal, for example hexagonal.

Elements, dimensions and angles as used in FIGS. 4 to 15, respectively, have been drafted in consideration of simplicity and clarity and not necessarily to scale. For example, the orders of magnitude of some of the elements, dimensions and angles, respectively, have been exaggerated with regard to other elements, dimensions and angles, respectively, in order to enhance comprehension of the examples of embodiment of the present invention.

The invention claimed is:

1. A method for manufacturing a solar concentrator, the method comprising:
providing a mold for press-molding a solar concentrator having a light entry face, a light exit face, a support frame including an outer flange, as well as, arranged between the light entry face and the light exit face and tapering in the direction of the light exit face, a light passage guide portion, which is restricted by a light-passage-guide-portion surface between the light entry face and the light exit face; the mold comprising a first mold and at least one second mold; and
press-molding glass between the first mold and the second mold to form the solar concentrator, in terms of the first mold molding the light entry face;
press-molding a surface of the support frame facing the light exit face by
means of a first mold part of the second mold and by means of a second mold part of the second mold, wherein the first mold part, at least partially, encloses the second mold part; and
press-molding the light exit face by means of at least a third mold part of the second mold.

2. The method as claimed in claim 1, wherein the first mold part, at least partially, encloses the third mold part.

3. The method as claimed in claim 2, wherein during press-molding the first mold contacts the first mold part.

4. The method as claimed in claim 3, wherein the glass is drawn into the second mold by means of a suction pressure prior to press-molding.

5. The method as claimed in claim 1, wherein during press-molding the first mold contacts the first mold part.

6. The method as claimed in claim 1, wherein the glass is drawn into the second mold by means of a suction pressure prior to press-molding.

7. The method as claimed in claim 6, wherein the solar concentrator, after press-molding, is drawn out of the second mold by means of a suction pressure generated in the first mold.

8. The method as claimed in claim 7, wherein the solar concentrator is subsequently cooled in a suspended state.

9. The method as claimed in claim 1, wherein the solar concentrator, after press-molding is drawn out of the second mold by means of a suction pressure generated in the first mold.

10. The method as claimed in claim 9, wherein the solar concentrator is subsequently cooled in a suspended state.

* * * * *

UNITED STATES PATENT AND TRADEMARK OFFICE
CERTIFICATE OF CORRECTION

PATENT NO.       : 9,139,461 B2
APPLICATION NO.  : 13/989096
DATED            : September 22, 2015
INVENTOR(S)      : Wolfram Wintzer, Lars Arnold and Hagen Goldammer It is certified that error appears in the above-identified patent and that said Letters Patent is hereby corrected as shown below:

on the title page item (73) Assignee: "Doctor Optics SE" should read --Docter Optics SE--.

Signed and Sealed this
First Day of March, 2016

Michelle K. Lee
*Director of the United States Patent and Trademark Office*